(12) United States Patent
Kawamura et al.

(10) Patent No.: US 8,760,172 B2
(45) Date of Patent: Jun. 24, 2014

(54) INSULATION MEASUREMENT APPARATUS

(75) Inventors: Yoshihiro Kawamura, Makinohara (JP);
Takafumi Tsurumi, Wako (JP);
Shintaro Uchida, Wako (JP)

(73) Assignees: Yazaki Corporation, Tokyo (JP);
Honda Motor Co., Ltd., Tokyo (JP)

( * ) Notice: Subject to any disclaimer, the term of this patent is extended or adjusted under 35 U.S.C. 154(b) by 261 days.

(21) Appl. No.: 13/315,684

(22) Filed: Dec. 9, 2011

(65) Prior Publication Data

US 2012/0081135 A1  Apr. 5, 2012

Related U.S. Application Data

(62) Division of application No. 12/470,170, filed on May 21, 2009, now Pat. No. 8,106,667.

(30) Foreign Application Priority Data

May 26, 2008 (JP) ................. P2008-137050

(51) Int. Cl.
*G01R 31/02* (2006.01)
(52) U.S. Cl.
USPC ........................................ 324/551; 324/541
(58) Field of Classification Search
USPC .......... 324/541, 551, 557, 525, 503, 691, 713
IPC .............................. Y04S 10/522; H02M 7/5387
See application file for complete search history.

(56) References Cited

U.S. PATENT DOCUMENTS

| | | | | |
|---|---|---|---|---|
| 5,150,059 A | * | 9/1992 | Bognar et al. | 324/551 |
| 6,169,444 B1 | * | 1/2001 | Thurber, Jr. | 327/536 |
| 6,642,721 B2 | | 11/2003 | Tsuchiya | 324/548 |
| 2007/0210805 A1 | | 9/2007 | Kawamura | 324/541 |
| 2008/0079404 A1 | | 4/2008 | Hayakawa et al. | 323/271 |

FOREIGN PATENT DOCUMENTS

JP  2007-170983  7/2007

* cited by examiner

*Primary Examiner* — Vincent Q Nguyen
(74) *Attorney, Agent, or Firm* — Morgan, Lewis & Bockius LLP (57) ABSTRACT

An insulation measurement apparatus includes a path including a first resistor, a capacitor electrically floated from a ground, and a second resistor between a positive to a negative electrode side of a power supply, a first switching element between the power supply positive electrode side and the capacitor, a second switching element between the capacitor and the power supply negative electrode side, a detection section detecting a charge voltage on the capacitor and determining a power supply insulation state, and a voltage setting section executing a power supply voltage measurement mode controlling the first and second switching elements to charge the capacitor for a predetermined time period, and an insulation voltage measurement mode charging a terminal of a positive or negative electrode side of the capacitor via a resistor between the power supply positive or negative electrode and the ground for a predetermined time period.

1 Claim, 5 Drawing Sheets

INSULATION MEASUREMENT APPARATUS

INSULATION MEASUREMENT APPARATUS

This application is a Divisional of U.S. patent application Ser. No. 12/470,170, now U.S. Pat. No. 8,106,667 which claims the benefit of Japanese Patent Application No. P2008-137050, filed in Japan on May 26, 2008, each of which is incorporated by reference herein in its entirety.

FIELD OF THE INVENTION

The present invention relates to an insulation measurement apparatus and, in particular, relates to an insulation measurement apparatus which can measure an insulation resistance accurately by using a ceramic capacitor as a flying capacitor.

Conventionally, an automotible mounts a battery for charging electric power therein and for supplying electric power to electrical equipments such as a light turning-on system and an air conditioner. Automobiles of the day depend on electric power as is no exaggeration to say that the automobiles cannot work without electric power.

Further, the regulation of exhaust gas has been enhanced in view of the battle against global warming etc. Thus, some of automotible manufacturers bring hybrid cars each employing an engine and a battery as driving power sources to the market. Such a tendency having been accelerated and so many automobiles employ batteries as driving power sources.

Under such the background, the management of electric power has become more important for automobile manufacturers. In particular, in the case of mounting a high-output battery for driving, since the voltage is very high as compared with the conventional voltage, the probability of getting an electric shock is high when the insulation property is degraded. Accordingly, it has become more important to monitor the insulation state.

Figure 1:
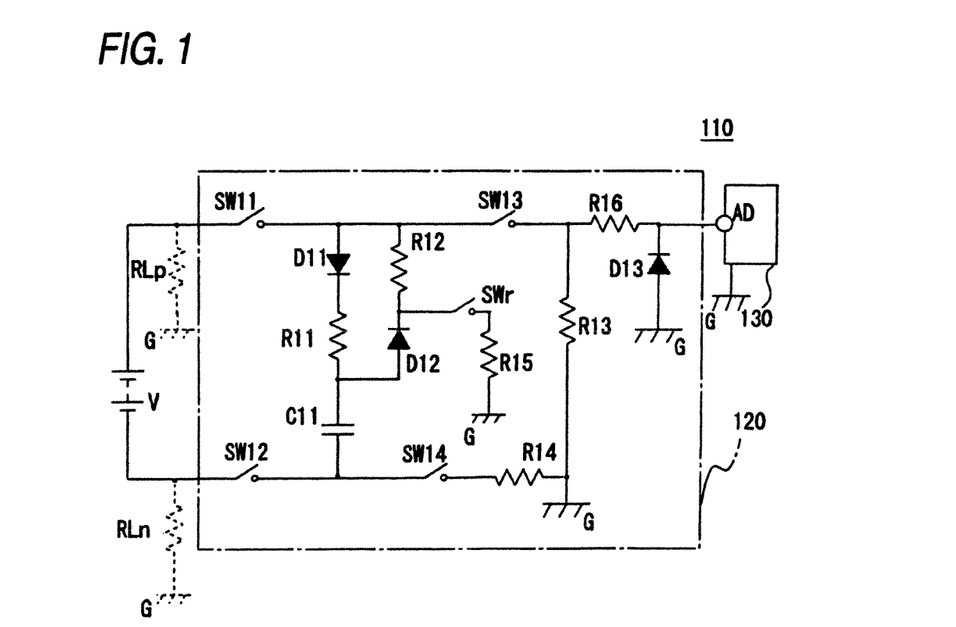
FIG. 1 is a diagram showing an insulation measurement circuit of a flying capacitor type according to a related art.

Although various types of techniques for determining the insulation state have been introduced, there is an insulation measurement circuit of a flying capacitor type, for example (see JP-A-2007-170983). FIG. 1 is a circuit diagram of an insulation measurement circuit 110 disclosed in JP-A-2007-170983. The insulation measurement circuit 110 is constituted by a detection circuit 120 and a determination control portion 130 and detects the insulation state of a power supply V. The detection circuit 120 includes a capacitor (flying capacitor) C11 in an electrically floated state from the ground voltage G, first to sixth resistors R11 to R16 and first to fourth switching elements SW11 to SW14. The determination control portion 130 turns the first and second switches SW11, SW12 on to form a path from the positive electrode side of the power supply V to the negative electrode side thereof via the first switch SW11, a first diode D11, the resistor R11, the capacitor C11 and the second switch SW12 to thereby set a voltage (this voltage is called "a high voltage V10") of the power supply V to the capacitor C11. When the first and second switches SW11, SW12 are turned off and the third and fourth switches SW13, SW14 are turned on, a closed circuit is formed by the capacitor C11, a second diode D12, the second resistor R12, the third switch SW13, the sixth resistor R16, the third resistor R13, the fourth resistor R14, the fourth switch SW14. Thus, a voltage divided by the second resistor R12, the third resistor R13 and the fourth resistor R14, that is, V10×R13/(R12+R13+R14) is inputted via the sixth resistor R16 into the determination control portion 130 (input port AD) and measured thereby. The cathode of a third diode D13 is coupled to a path between the sixth resistor R16 and the input port AD in a manner that anode of the third diode D13 is coupled to the ground voltage G. When the measurement is completed, the third switch SW13 is turned off and a discharge switch SWr is turned on to thereby discharge electric charges of the capacitor C11 via the fifth resistor R15.

Next, the determination control portion 130 charges the capacitor C11 in a state that the one end of the capacitor C11 is grounded via the fourth resistor R14 and measures the voltage set to the capacitor C11. To be more concrete, firstly the determination control portion 130 turns the first switch SW11 and the fourth switch SW14 on. In response to this turning-on operation, there is formed a path from the ground voltage G to the ground voltage G via a negative electrode side grounding resistor RLn, the power supply V, the first switch SW11, the first diode D11, the first resistor R11, the capacitor C11, the fourth switch SW14 and the fourth resistor R14. In this case, a charge voltage VC11 (negative electrode side grounding resistor voltage) is set to the capacitor C11. Then, when the first switch SW11 is turned off and the third switch SW13 is turned on, in the similar manner to the aforesaid case, a divided voltage of the charge voltage VC11 set to the capacitor C11, that is, VC11×R13/(R12+R13+R14) is inputted via the sixth resistor R16 in the determination control portion 130 and measured thereby. When the measurement is completed, the third switch SW13 is turned off and the discharge switch SWr is turned on to thereby discharge electric charges of the capacitor C11 via the fifth resistor R15.

Next, the determination control portion 130 turns the second switch SW12 and the third switch SW13 on. In response to this turning-on operation, there is formed a path from the ground voltage G to the ground voltage G via the third resistor R13, the third switch SW13, the first diode D11, the first resistor R11, the capacitor C11, the second switch SW12, the power supply V and a positive electrode side grounding resistor RLp. In this case, a charge voltage VC12 (positive electrode side grounding resistor voltage) is set to the capacitor C11. Then, when the second switch SW12 is turned off and the fourth switch SW14 is turned on, in the similar manner to the aforesaid case, a divided voltage of the charge voltage VC12 set to the capacitor C12, that is, VC12×R13/(R12+R13+R14) is inputted via the sixth resistor R16 int the determination control portion 130 and measured thereby. When the measurement is completed, the third switch SW13 is turned off and the discharge switch SWr is turned on to thereby discharge electric charges of the capacitor C11 via the fifth resistor R15.

Succeedingly, the determination control portion 130 performs the insulation resister conversion based on a calculation expression (VC11+VC12)/V10 to thereby detect the state of the grounding resistor RL with reference to a predetermined table. When the grounding resistor RL thus detected is equal to or smaller than a predetermined threshold value RLy, the determination control portion 130 determines that the insulation property is degraded and so outputs a predetermined alarm.

The insulation resistance value RLy acting as the threshold value of the positive electrode side grounding resistor RLp and the negative electrode side grounding resistor RLn is required to have the highest detection accuracy. Peripheral circuit constants and respective charge time periods are set so that the charge voltages VC11, VC12 at the time of being determined as the insulation resistance value RLy become equal to the high voltage V10. In recent years, the configuration of employing a ceramic capacitor as the capacitor C in order to miniaturize the insulation measurement circuit 10 has been sometimes employed. However, in this case, it is necessary to take the influence of the DC bias characteristics into consideration. A coefficient relating to the influence of such the characteristics is set to be α and a coefficient relating to the influence of the variations of the peripheral circuit is set to be β. The insulation resistance value is obtained by using an insulation resistance value conversion expression shown in the following expression (A1). In the case of obtaining the insulation resistance value at the time where the negative electrode side grounding resistor RLn is degraded and becomes the predetermined, since the peripheral circuit constants and the respective charge time periods are set so that the charge voltage VC11 becomes equal to the high voltage V10, the influences (coefficients α) on the charge voltage VC11 and the high voltage V10 due to the DC bias characteristics coincide to each other. Thus, the insulation resistance value conversion expression as to the threshold value Rly can be shown in the following expression (A1).

$$\text{Insulation resistance value conversion expression} = \quad (A1)$$
$$((VC11 \times \alpha \times \beta + VC12 \times \alpha' \times \beta)/(VC10 \times \alpha \times \beta)) =$$
$$VC11 \times \alpha \times \beta/(VC10 \times \alpha \times \beta) = VC11/VC10$$

That is, α and β at each of the numerator and the denominator are cancelled. In other words, since the influences due to the variations of the characteristics of the capacitor C11 and the peripheral circuits can be excluded, the measurement can be made accurately. In a range that the accuracy is not required where the insulation resistance value does not coincide with the threshold value Rly, the variation of the ceramic capacitor (capacitor C11) due to the DC bias characteristics is corrected by using a software in a manner of approximating the general DC bias characteristics. By employing such the technique, the measuring time period is shortened and such an influence on the ceramic capacitor due to the DC bias characteristics that the capacitance value of the capacitor reduces in accordance with the increase of an applied voltage is removed.

Figure 2:
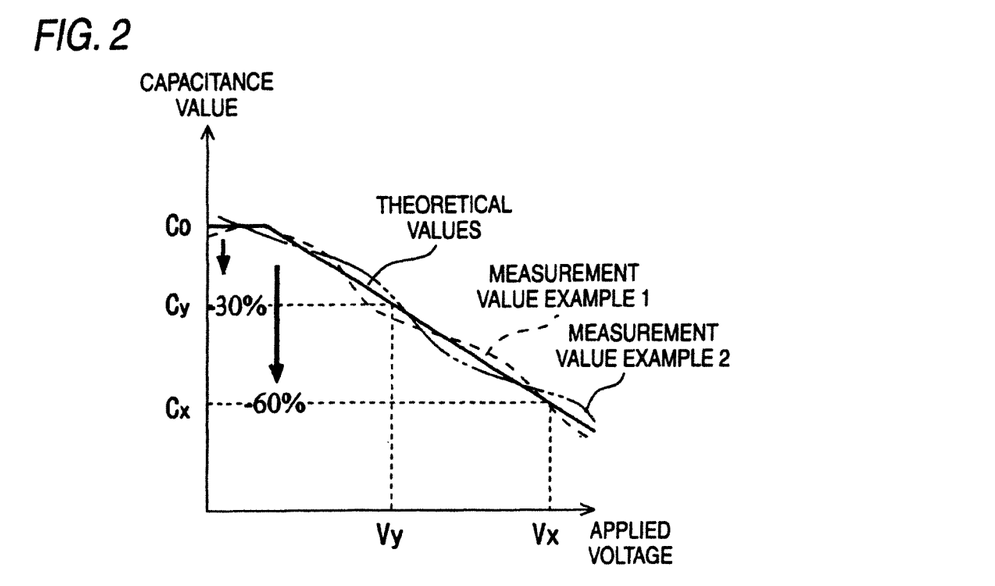
FIG. 2 is a graph showing the DC bias characteristics of a general ceramic capacitor.

As shown in FIG. 2, unlike a film capacitor, the ceramic capacitor has the aforesaid DC bias characteristics. A steady line represents theoretical values. The individual ceramic capacitors have variances and errors in their characteristics as shown by a dotted line (a measurement value example 1) and a two-dot chain line (a measurement value example 2) in the figure. Thus, since the directions and widths of the variances with respect to the theoretical values are not constant depending on the applied voltage, it is difficult to improve the detection accuracy as the entirety of the apparatus.

To be concrete, in the case of measuring the grounding resistor RL, the charge resistor for the high voltage V10 is R11, whilst the charge resistor for the charge voltages VC11, VC12 is R11+RL (RLp or RLn). In this case, the peripheral circuit constants and respective charge time periods are set so that the charge voltages VC11, VC12 become equal to the high voltage V10 when the grounding resistor RL is the aforesaid threshold value Rly. The charge time period of the high voltage V10 was set to be shorter than the charge time period of the charge voltages VC11, VC12. The DC bias characteristics of the capacitor C11 changes depending on the voltage applying time period as well as the change of the applied voltage. As a result, the influence of the DC bias characteristics at the time of measuring the high voltage V10 does not coincide with the influence of the DC bias characteristics at the time of measuring the charge voltages VC11, VC12. Thus, there arise a problem that the influence of the coefficient α in the aforesaid expression (A1) can not be excluded. Further, since the degree of the change differs depending on the individual devices (ceramic capacitors), there also arises a problem that the correction can not be performed completely by the software.

Further, there arises a problem that the cost of the apparatus becomes very high when the requirement of the accuracy with respect to the aforesaid variances of the ceramic capacitor is made restrict. In particular, in recent years, since there are supposed cases which are insufficient in the accuracy that have been allowed conventionally, a new technique has been demanded capable of being employed in view of the accuracy and cost.

SUMMARY OF THE INVENTION

The invention is made in view of such a circumstance and an object of the invention is to provide an insulation measurement technique of a flying capacitor type which realizes a desired accuracy.

In order to achieve the above object, according to the present invention, there is provided an insulation measurement apparatus, comprising:

a path including a first resistor, a capacitor in a state electrically floated from a ground potential, and a second resistor coupled in series sequentially from a positive electrode side of a power supply to a negative electrode side of the power supply;

a first switching element provided in a path from the positive electrode side of the power supply to the capacitor;

a second switching element provided in a path from the capacitor to the negative electrode side of the power supply;

a detection section which detects a charge voltage set to the capacitor and determines an insulation state of the power supply; and a voltage setting section which executes a power supply voltage measurement mode for charging the capacitor by a voltage of the power supply for a predetermined voltage applying time period to measure the voltage of the power supply, and an insulation voltage measurement mode for charging a terminal of a positive electrode side or a negative electrode side of the capacitor via a resistor between the positive electrode or the negative electrode of the power supply and the ground potential for a predetermined voltage applying time period to measure a voltage of the insulation resistor by controlling the first and second switching elements, wherein a charge resistance value at a time of charging the capacitor by the voltage of the power supply in the power supply voltage measurement mode is set to be a sum of a value of the first resistor and a value of the second resistor, wherein a charge resistance value at a time of charging the terminal of the positive electrode side or the negative electrode side of the capacitor via the resistor between the positive electrode or the negative electrode of the power supply and the ground potential in the insulation voltage measurement mode is set to be a sum of the value of the first resistor or the value of the second resistor and the insulation resistor, wherein each of the value of the first resistor and the value of the second resistor is set to be same as an insulation resistance value of a threshold value of a value representing the insulation state; and wherein a voltage applied to the capacitor and the voltage applying time period thereof when the detection section determines that the insulation state coincides with the threshold value are respectively same as a voltage applied to the capacitor and the voltage applying time period thereof at a time of charging by the voltage of the power supply.

Preferably, the capacitor is a ceramic capacitor.

Preferably, the insulation measurement apparatus further includes a discharge section which discharges the charge voltage set to the capacitor.

Preferably, a charge time period of the capacitor is set to be shorter than a full-charge time period.

Here, it is preferable that, the detection section has a table for determining the insulation state based on the voltage of the power supply set in the power supply voltage measurement mode and the voltage set to the terminal of the positive electrode side or the negative electrode side of the capacitor in the insulation voltage measurement mode.

According to the present invention, there is also provided an insulation measurement apparatus for charging a flying capacitor by a voltage of a power supply for measuring insulation resistors on a positive electrode side and a negative electrode side of the power supply, comprising:

a high voltage measurement section which charges the flying capacitor by the voltage of the power supply without passing the insulation resistor for measuring a charged voltage of the flying capacitor;

a ground resistor voltage measurement section which charges the flying capacitor by the voltage of the power supply via the insulation resistor on the positive electrode side or the negative electrode side for measuring the charged voltage of the flying capacitor; and an insulation resistor calculation section which obtains the insulation resistor based on the voltage measured by the high voltage measurement section, the voltage measured by the ground resistor voltage measurement section and an insulation resistor conversion expression, wherein the flying capacitor is a ceramic capacitor; and wherein a charge time period of the flying capacitor in the high voltage measurement section at a time of measuring the insulation resistor is set so as to be same as a charge time period of the flying capacitor in the ground resistor voltage measurement section at the time of measuring the insulation resistor.

According to the present invention, there is also provided an insulation measurement apparatus for charging a flying capacitor by a voltage of a power supply for measuring insulation resistors on a positive electrode side and a negative electrode side of the power supply voltage, wherein the flying capacitor is configured by a plurality of capacitors including a ceramic capacitor, the capacitors being coupled in series.

According to the invention, it is possible to provide the insulation measurement technique of the flying capacitor type which can realizes a desired accuracy.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Hereinafter, the best mode (hereinafter referred to "an embodiment") for implementing the invention will be explained with reference to drawings.

First Embodiment

Figure 3:
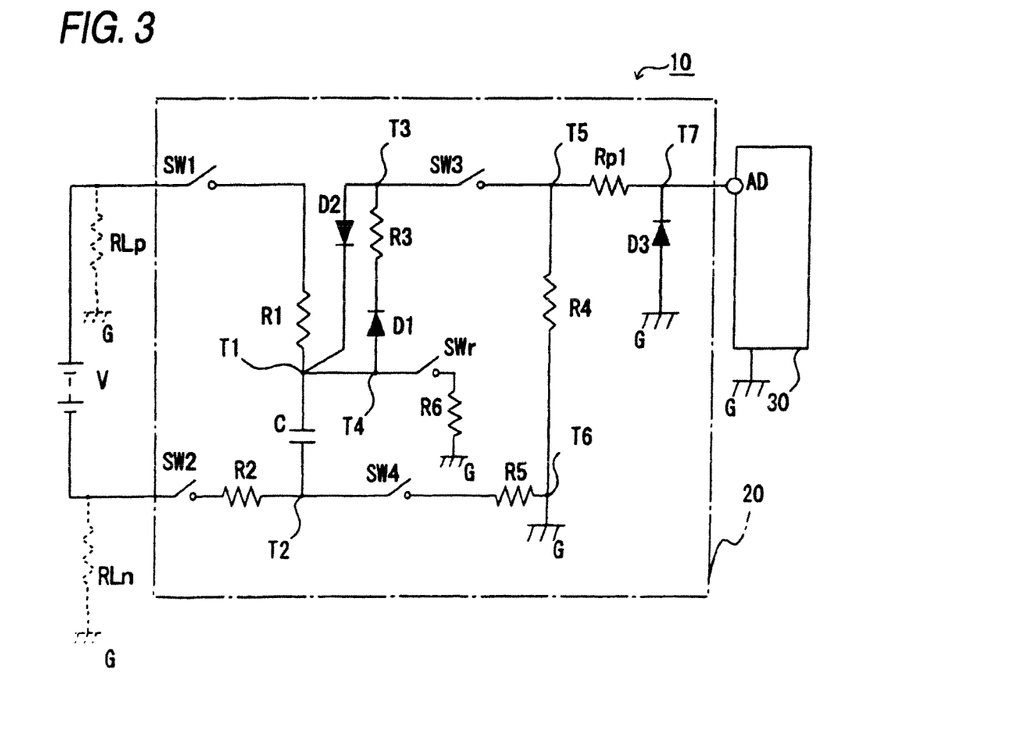
FIG. 3 is a circuit diagram showing the configuration of an insulation measurement circuit according to the first embodiment.

FIG. 3 is a circuit diagram showing the configuration of an insulation measurement circuit 10 according to the embodiment. As shown in the figure, the insulation measurement circuit 10 is configured by a detection circuit 20 and a determination control portion 30. A short-circuit is detected by checking the insulation state of a high-voltage power supply V coupled to the detection circuit 20. In this embodiment, the detection is made as to the insulation state of a resistor RLp as the insulation resistor on the positive electrode side of a power supply V and the insulation state of a resistor RLn as the insulation resistor on the negative electrode side. When it is not necessary to distinguish between the resistor RLp and the resistor RLn, these resistors are merely called the "grounding resistor RL".

Figure 4:
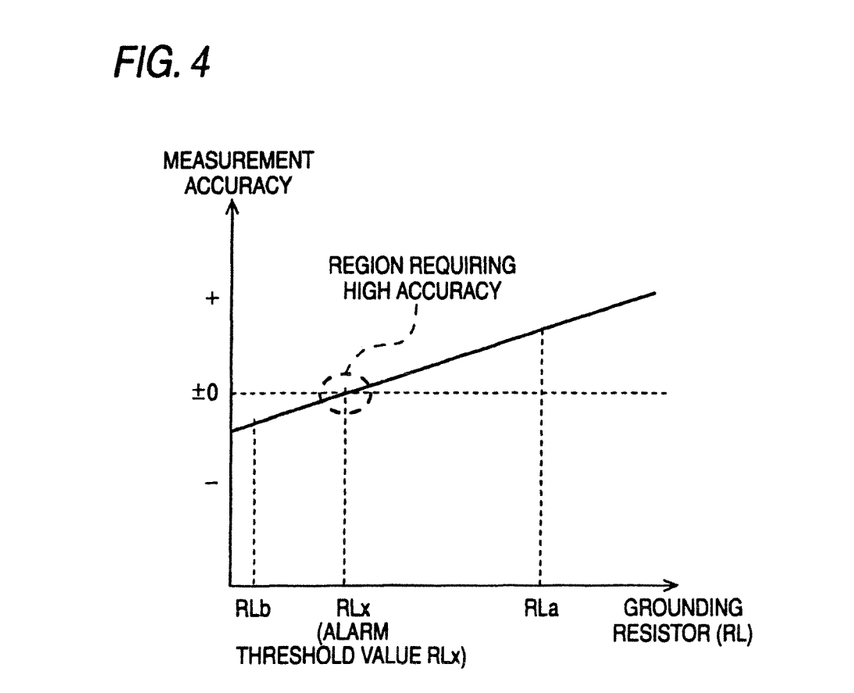
FIG. 4 is a graph showing the relation between measurement accuracy and a grounding resistor according to the first embodiment.

The explanation will be made with reference to FIG. 4 as to the deterioration and he detection accuracy of the insulation resistor in the insulation measurement circuit 10. In an automobile etc., the insulation state with respect to the power supply V deteriorates gradually in some cases. For example, the resistance value of the resistor RL serving as an index of the insulation state reduces gradually from a value Rla representing the good insulation state and reaches a threshold value RLx (hereinafter called an "alarm threshold value RLx") representing that the insulation state has deteriorated. When the insulation state further deteriorates, the resistance value reaches a value RLb representing the insulation failure. In general, when it is detected that the value of the resistor RL reaches the value RLx, it is notified by an alarm lamp etc. that the insulation deterioration occurs.

The insulation measurement circuit 10 is required to have a high detection accuracy when the value of the resistor RL approaches the value RLx. When the value of the resistor RL is larger than the value RLx (for example, equals to RLa), if the detection accuracy is in a state that the value of the resistor RL is detected slightly larger than the actual value, the value of the insulation resistor is detected slightly larger than the actual value due to the DC bias characteristics of a ceramic capacitor when the ceramic capacitor is used as the flying capacitor. Thus, such a determination is not made that the occurrence of the insulation deterioration is detected despite that the insulation deterioration does not occur yet. In contrast, when the value of the resistor RL is larger than the value RLx (for example, equals to RLb), the value of the insulation resistor is detected slightly smaller than the actual value due to the DC bias characteristics of the ceramic capacitor. Thus, such a determination is not made that the value of the grounding resistor does not reach the value RLx and so the insulation state is good despite that the insulation deterioration has occurred. Thus, the insulation measurement circuit 10 according to the embodiment is arranged to remove the influence of the DC bias characteristics on the capacitor C using the ceramic capacitor which is the bottle-neck for realizing the high detection accuracy when the value of the resistor RL is near the value RLx. To this end, although the detailed explanation will be made later, a voltage VC1$p$ or a voltage VC1$n$ set to the capacitor C is made coincide with a voltage VO set to the capacitor C by the power supply V and also the charge time periods at this time are made coincide. Thus, it becomes possible to eliminate the influence of the DC bias characteristics, which changes depending on the applying voltage and the voltage applying time period, on the capacitor C using the ceramic capacitor.

The explanation will be returned to FIG. 3. The determination control portion 30 is provided with an input port AD, and has a voltage measurement function of subjecting the voltages (VC1$p$, VC1$n$, VO) inputted into the input port AD to an A/D conversion processing and measuring the voltages thus converted and a function of controlling the opening/closing operations of first to fourth switches SW1 to SW4 provided in the detection circuit 20 explained later. Further, the determination control portion 30 subjects the voltages (VC1$p$, VC1$n$, VO) inputted into the input port AD to an insulation resistor conversion by using a calculation expression VC1/VO. The determination control portion 30 has a predetermined table for storing insulation resistance values corresponding to the calculation expression VC1/VO and specifies the value with reference to the table.

The detection circuit 20 is arranged in a manner that the first switch SW1, a first resistor R1, the capacitor C, a second resistor R2 and the second switch SW2 are coupled in series sequentially from the positive electrode side to the negative electrode side of the power supply V. In the following explanation, the values of the resistors are shown by the same symbols as those of the resistors, respectively (for example, the resistance value of the first resistor R1 is shown by R1). The locations of the first switch SW1 and the first resistor R1 may be exchanged. Similarly, the locations of the second switch SW2 and the second resistor R2 may be exchanged. Further, the resistance value of the first resistor R1 is set to be same as the resistance value of the second resistor R2.

The positive electrode side terminal (first terminal point T1) coupled to the first resistor R1 of the terminals of the capacitor C is coupled to the terminal (second terminal point T2) coupled to the second resistor R2 of the capacitor C via a series connection of the first diode D1, the third resistor R3, the third switch SW3, the fourth resistor R4, a fifth resistor R5 and the fourth switch SW4. Further, a series connection of a discharge switch SWr and a sixth resistor R6 is coupled to a ground voltage G from a fourth terminal point T4 on the way of the path formed between the capacitor C and the first diode D1. In the capacitor C, the terminal (first terminal point T1) coupled to the first resistor R1 is called "a high voltage side terminal" and the terminal (second terminal point T2) coupled to the second resistor R2 is called "a low voltage side terminal."

A second diode D2 is coupled between the first terminal point T1 and a third terminal point T3 where the third resistor R3 and the third switch SW3 are coupled. That is, the second diode D2 is coupled between the first terminal point T1 and the third terminal point T3 in parallel to the path where the first diode D1 and the third resistor R3 are coupled. The forward direction of the first diode D1 is a direction toward the third resistor (third terminal point T3) from the capacitor C (first terminal point T1). The forward direction of the second diode D2 is a direction toward the capacitor C (first terminal point T1) from the third resistor (third terminal point T3).

Further, a fifth terminal point T5 on the way of the path formed between the third switch SW3 and the fourth resistor R4 is coupled to the input port AD via a protection resistor Rp1. Also, a sixth terminal point T6 on the way of the path formed between the fourth resistor R4 and the fifth resistor R5 is coupled to the ground voltage G. Further, a seventh terminal point T7 on the way of the path formed between the protection resistor Rp1 and the input port AD is coupled to the ground voltage G via a third diode D3. The forward direction of the third diode D3 is a direction toward the seventh terminal point T7 from the ground voltage G. The resistance value of the fifth resistor R5 is set to be same as that of the fourth resistor R4.

Figure 5A:
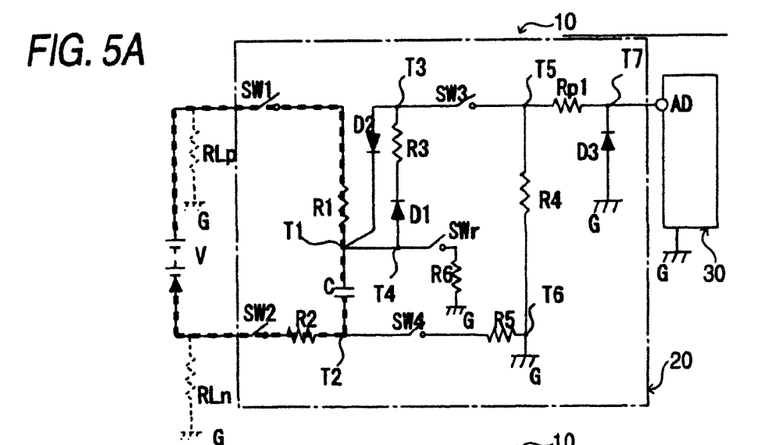
FIGS. 5A to 5C are Diagrams showing closed circuits formed in respective measurement modes according to the first embodiment.
Figure 5B:
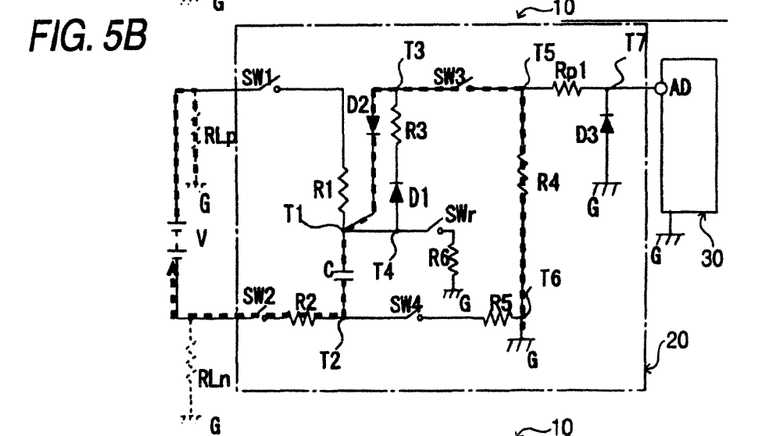
Figure 5C:
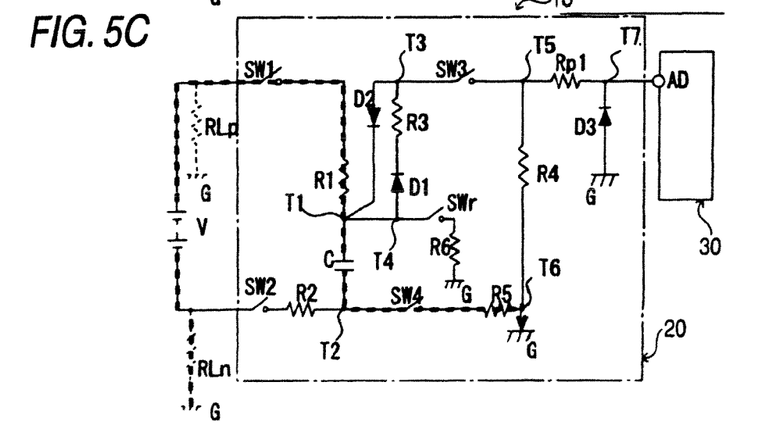

The explanation will be made as to the determination procedure of the insulation state of the power supply V according to the aforesaid configuration. FIG. 5 show diagrams of closed circuits formed at the times of respective measurement modes.

The summary of the determination procedure is shown in the following procedures 1) to 4).

1) High Voltage V0 Measurement Mode

As shown by a thick broken line in FIG. 5($a$), the determination control portion 30 turns each of the first switch SW1 and the second switch SW2 on for a predetermined time period to thereby set a voltage V0 (hereinafter called a "high voltage V0") by the power supply V to the capacitor C. Then, the determination control portion 30 turns each of the first switch SW1 and the second switch SW2 off and turns each of the third switch SW3 and the fourth switch SW4 on, whereby the input port AD measures a value (a value obtained by dividing the high voltage V0) corresponding to the high voltage V0 set to the capacitor C. In this case, a value of the charge resistor Rc0 satisfies the following expression (B1).

$$Rc0=R1+R2 \quad (B1)$$

When the measurement is completed, the determination control portion 30 turns the third switch SW3 off and turns only the fourth switch SW4 and the discharge switch SWr on to thereby discharge the electric charges of the capacitor C.

2) Positive Electrode Side Grounding Resistor Voltage VC1$p$

Then, as shown by a thick broken line in FIG. 5($b$), the determination control portion 30 turns each of the second switch SW2 and the third switch SW3 on to thereby set a voltage (hereinafter called a "positive electrode side grounding resistor voltage VC1$p$") via the positive electrode side grounding resistor RLp by the power supply V to the capacitor C. Then, the determination control portion 30 turns the second switch SW2 off and turns the fourth switch SW4 on, whereby the input port AD measures a value (a value obtained by dividing the positive electrode side grounding resistor voltage VC1$p$) corresponding to the positive electrode side grounding resistor voltage VC1$p$ set to the capacitor C. In this case, a value of the charge resistor Rcp satisfies the following expression (B2).

$$Rcp=R2+R4+RLp \quad (B2)$$

When the measurement is completed, the determination control portion 30 turns the third switch SW3 off and turns only the fourth switch SW4 and the discharge switch SWr on to thereby discharge the electric charges of the capacitor C.

3) Negative Electrode Side Grounding Resistor Voltage VC1$n$

Then, as shown by a thick broken line in FIG. 5($c$), the determination control portion 30 turns each of the first switch SW1 and the fourth switch SW4 on to thereby set a voltage (hereinafter called a "negative electrode side grounding resistor voltage VC1$n$") via the negative electrode side grounding resistor RLn by the power supply V to the capacitor C. Then, the determination control portion 30 turns the second switch SW2 off and turns the fourth switch SW4 on, whereby the input port AD measures a value (a value obtained by dividing the negative electrode side grounding resistor voltage VC1$n$) corresponding to the negative electrode side grounding resistor voltage VC1$n$ set to the capacitor C. In this case, a value of the charge resistor Rcn satisfies the following expression (B3).

$$Rcn = R1 + R5 + RLn \quad (B3)$$

When the measurement is completed, the determination control portion 30 turns the third switch SW3 off and turns only the fourth switch SW4 and the discharge switch SWr on to thereby discharge the electric charges of the capacitor C. Hereinafter, when it is not necessary to distinguish between the positive electrode side grounding resistor voltage VC1$p$ and the negative electrode side grounding resistor voltage VC1$n$), these voltages are merely called the "charge voltage VC1."

4) Insulation Resistor Conversion Mode

Then, the determination control portion 30 performs the insulation resistor conversion based on the following expression (B4) in accordance with the aforesaid measurement result.

$$\text{Insulation resistor conversion} = (VC1p + VC1n)/V0 \quad (B4)$$

For example, when the insulation property of the one electrode degrades, the grounding resistor voltage VC1 (VC1$p$ or VC1$n$) of the electrode on the insulation side becomes high and the voltage on the side where the insulation property degrades becomes 0 volt. Since the high voltage V0, the positive electrode side grounding resistor voltage VC1$p$ and the negative electrode side grounding resistor voltage VC1$n$ are inputted into the determination control portion 30 at the same voltage dividing ratio even if the measurement mode differs, the voltage dividing ratio is constant irrespective of the expression (B4).

Supposing that R1=R2 and R4=R5=Ra and the following expression is satisfied, $$R1 = R2 = RL + Ra(RLp + Ra) \text{ or } RL + Ra(RLn + Ra) \quad (B5)$$

the expressions (B1) to (B3) become same in each of the measurement modes of the high voltage V0, the positive electrode side grounding resistor voltage VC1$p$ and the negative electrode side grounding resistor voltage VC1$n$ relating to the insulation resistor value calculation. As a result, when the value of the ground resistor RL is the alarm threshold value RLx, the high voltage V0, the positive electrode side grounding resistor voltage VC1$p$ and the negative electrode side grounding resistor voltage VC1$n$ are set in a state that the applied voltage thereof are same and the voltage application time periods thereof are same. Thus, the values of the high voltage V0, the positive electrode side grounding resistor voltage VC1$p$ and the negative electrode side grounding resistor voltage VC1$n$ can be measured in a state of removing the influence on the capacitor C due to the DC bias characteristics which changes depending on the applied voltage and the voltage application time period.

That is, since each of R1 and R2 is set to be same as the sum of the alarm threshold value RLx and Ra, if the value of the ground resistor RL is same as the alarm threshold value RLx, the charge constant becomes same in all the measurement modes. Thus, when the charge time periods of the high voltage V0, the positive electrode side grounding resistor voltage VC1$p$ and the negative electrode side grounding resistor voltage VC1$n$ are set to be same in a time range not reaching the full charge state, each of the high voltage V0, the positive electrode side grounding resistor voltage VC1$p$ and the negative electrode side grounding resistor voltage VC1$n$ is charged to the same voltage after this charge time period. As a result, the influence of the DC bias characteristics appearing on the capacitor C can be made same in all the measurement modes of the positive electrode side grounding resistor voltage VC1$p$ and the negative electrode side grounding resistor voltage VC1$n$ at the time of the degradation of the insulation property (at the time of the alarm threshold value RLx) and the high voltage V0.

That is, under the condition that one of the positive electrode side grounding resistor RLp and the negative electrode side grounding resistor RLn becomes the alarm threshold value RLx, the voltage change (coefficient α) of the capacitor C due to the DC bias characteristics and the variance (coefficient β) of the measurement circuit appearing at the numerator and the denominator of the insulation resistor conversion expression shown in the aforesaid expression (B4) can be made all same. Thus, the influence (coefficient α) due to the DC bias characteristics and the variance (coefficient β) of the measurement circuit are completely canceled on the insulation resistor conversion expression in the aforesaid expression (B4) and so does not affect on the detection of the insulation resistor at all.

For example, when RLp+Ra=R2 and RLn+Ra=high resistance value (nearly equal to infinite), as described above, since the voltage VC1 of the electrode on the insulation side is 0 volt (in this case, the negative electrode side grounding resistor voltage VC1$n$=0), the insulation resistor conversion expression is shown by the following expression.

The insulation resistor conversion expression =

$$(VC1p \times \alpha \times \beta + VC1n(=0) \times \alpha' \times \beta)/(V0 \times \alpha \times \beta) =$$

$$(VC1p \times \alpha \times \beta)/(V0 \times \alpha \times \beta) = VC1p/V0$$

Further, when RLp+Ra=R1 and RLp+Ra=high resistance value (nearly equal to infinite), as described above, since the voltage VC1 of the electrode on the insulation side is 0 volt (in this case, the positive electrode side grounding resistor voltage VC1$p$=0), the insulation resistor conversion expression is shown by the following expression.

The insulation resistor conversion expression =

$$(VC1p(=0) \times \alpha'' \times \beta + VC1n \times \alpha \times \beta)/(V0 \times \alpha \times \beta) =$$

$$(VC1n \times \alpha \times \beta)/(V0 \times \alpha \times \beta) = VC1n/V0$$

Thus, as explained above in FIG. 4, when each of R1 and R2 is set to be same as the sum of the alarm threshold value RLx and Ra, the detection accuracy of the most important portion can be surely secured practically. Further, in the case of a resistance value smaller than the alarm threshold value RLx, surely a value smaller than the alarm threshold value RLx, that is, the degradation state of the insulation property is detected, so that there does not arise a practical problem. Further, in the case where the value of the grounding resistor RL is large, even if the detection accuracy is bad, when the resistance value is equal to or larger than the alarm threshold value RLx and it is determined that the resistor has not degraded yet, there does not arise a practical problem. If the detection accuracy is required to be improved in the region, the practically sufficient accuracy can be obtained by correcting using the software, whereby the detection accuracy can be improved in a wide range.

According to the embodiment, in the insulation measurement circuit 10 of the flying capacitor type, even if a ceramic capacitor is used as the capacitor C, the influence of the DC bias characteristics peculiar to the ceramic capacitor can be removed. Thus, the high measurement accuracy can be realized in the insulation measurement circuit 10 using the ceramic capacitor as the flying capacitor.

Second Embodiment

Figure 6:
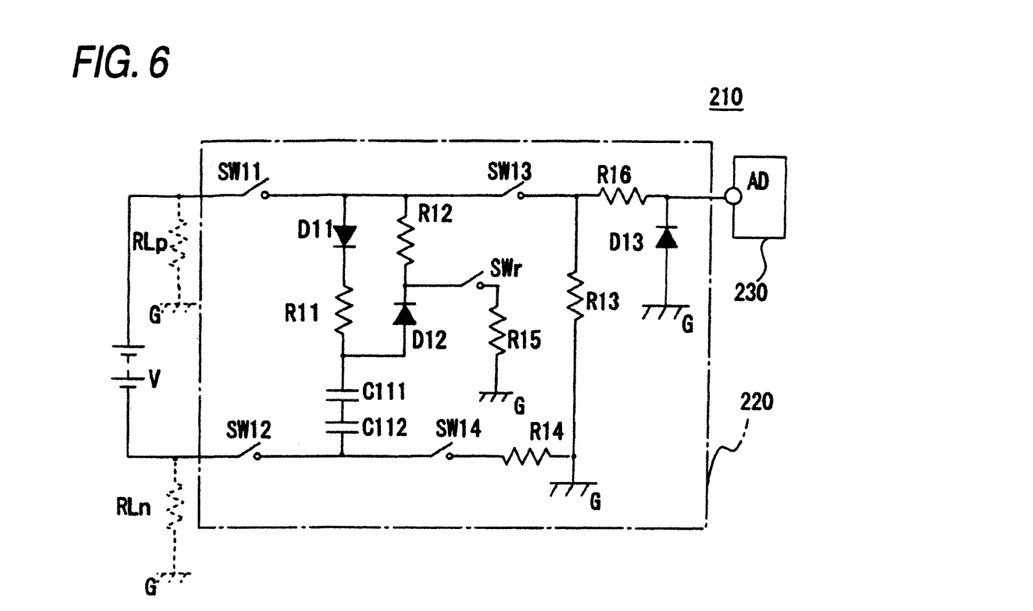
FIG. 6 is a circuit diagram showing the configuration of an insulation measurement circuit according to the second embodiment.

FIG. 6 is a circuit diagram showing the configuration of an insulation measurement circuit 210 according to this embodiment. As shown in the figure, the insulation measurement circuit 210 is configured by a detection circuit 220 and a determination control portion 230. The insulation measurement circuit 210 is configured in a manner that a series connection of a first capacitor C11 and a second capacitor C12 having the same capacitance value is coupled as the flying capacitor in place of the capacitor C11 of the detection circuit 120 of the related art (JP-A-2007-170983) of FIG. 1. Of course, a series connection of three or more capacitors may be coupled. The determination control portion 230 has the same function as the determination control portion 30 of the first embodiment and the determination control portion 130 of the related art (FIG. 1). Since the arrangements, connection states and the circuit operations of respective devices such as resistors and switches other than the first and second capacitors C111, C112 in this embodiment are same as those of the first embodiment, the detailed explanation thereof is omitted. Further, although not shown, the embodiment can also be applied to the capacitor C of the first embodiment and a capacitor of other insulation measurement circuit of the flying capacitor type.

In this manner, since the first and second capacitors C111, C11 as the ceramic capacitors are coupled in series, the voltage applied to the single capacitor (C111, C112) can be dispersed. As a result, the influence of the DC bias characteristics can be reduced.

For example, with reference to FIG. 2 showing the DC bias characteristics, the explanation will be made as to a case where the first capacitor C111 (or the second capacitor C112) has a capacitance value of 1 µF and the capacitance changing characteristics of the inclination −1.

It is supposed that the capacitance changing characteristics in the case of the single capacitor, that is, the first capacitor C111 (or the second capacitor C112) reduces by 60%, that is, to 0.4 µF from 1 µF as shown by C0 where the applied voltage is about 0 volt and Cx where the applied voltage is Vx. When the first and second capacitors C111, C112 are coupled in series, since the applied voltage becomes Vy which is the half of Vx, the change range per one capacitor becomes −30% as shown by C0 and Cy. In this case, two capacitors each having a capacitance value of 2 µF are coupled in series. In this case, capacitance value of each of the first and second capacitors C111, C112 changes from 2 µF to 1.4 µF.

As clear from the figure, the variance of the DC bias characteristics of the ceramic capacitor does not become small in accordance with the reduction of the capacitance value even in the case where the applied voltage increases and so the capacitance value becomes small due to the DC bias characteristics of the ceramic capacitor. That is, there is a case that the width of the variance is constant or becomes larger. However, the ratio of the variance is within a certain value.

Figure 7:
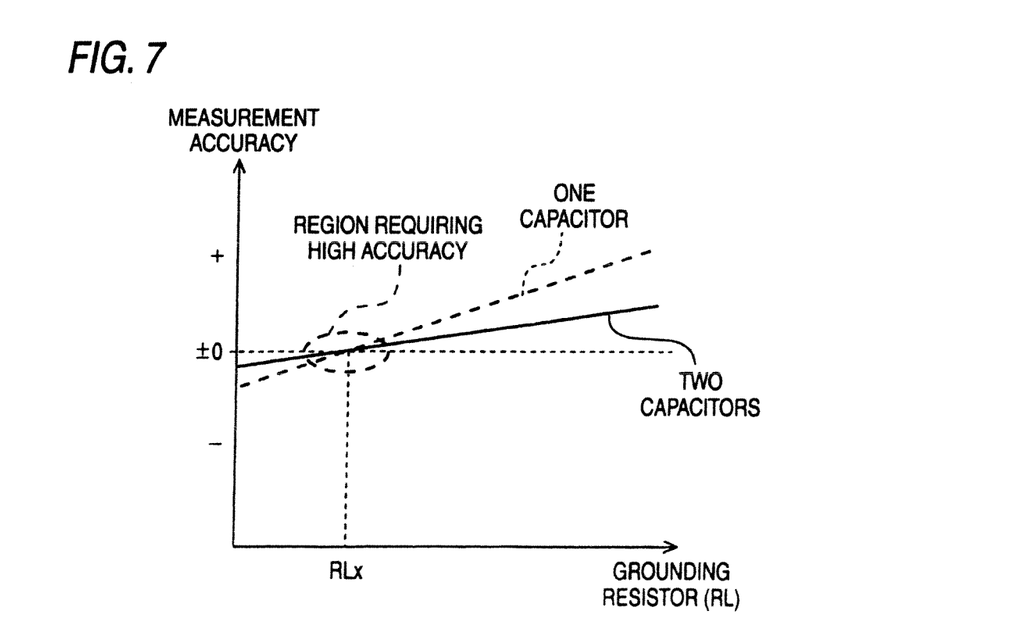
FIG. 7 is a graph showing the relation between measurement accuracy and a grounding resistor according to the second embodiment.

Thus, according to this embodiment, since a plurality of the ceramic capacitors each having the same capacitance value are coupled in series, the ratios of the variances of the respective capacitors are same but the total capacitance value of the capacitors becomes the plural times of that of the single capacitor. Therefore, the maximum value of the ratio of the variance becomes one/plural numbers and so the influence of the variance of the DC bias characteristics can be reduced. As a result, as shown by a steady line in FIG. 7, the detection accuracy can be improved.

The invention is explained above based on the embodiments. However, these embodiments are mere examples and it will be understood for those skilled in the art that various modifications may be made in the respective constituent elements an the combination thereof and such the modifications are within the range of the invention.

The present application is based on Japanese Patent Application No. 2009-137050 filed on May 26, 2008, the contents of which are incorporated herein for reference.

What is claimed is:

1. An insulation measurement apparatus for charging a flying capacitor by a voltage of a power supply and for measuring an insulation resistance between a positive electrode of the power supply and a ground potential and an insulation resistance between a negative electrode of the power supply and the ground potential, comprising:

a high voltage measurement section which charges the flying capacitor by the voltage of the power supply without passing the insulation resistances for measuring a charged voltage of the flying capacitor;

a ground resistor voltage measurement section which charges the flying capacitor by the voltage of the power supply via the insulation resistance between the positive electrode and the ground potential or the negative electrode and the ground potential for measuring the charged voltage of the flying capacitor; and an insulation resistance calculation section which obtains the insulation resistances based on the voltage measured by the high voltage measurement section, the voltage measured by the ground resistor voltage measurement section, and an insulation resistance conversion expression, wherein the flying capacitor is a ceramic capacitor, and
wherein a charge time period of the flying capacitor by the high voltage measurement section is set to be same as a charge time period of the flying capacitor in the ground resistor voltage measurement section.

* * * * *